United States Patent
Andre et al.

(10) Patent No.: US 10,194,568 B2
(45) Date of Patent: Jan. 29, 2019

(54) SEMI-FINISHED PRODUCT MADE FROM COMPOSITE MATERIAL, COMPRISING A FLEXIBLE ELECTROMAGNETIC SHIELDING FILM

(71) Applicant: Compagnie Plastic Omnium, Lyons (FR)

(72) Inventors: Gerald Andre, Amberieu en Bugey (FR); Hugues Cheron, Meximieux (FR)

(73) Assignee: Compagnie Plastic Omnium, Lyons (FR)

( * ) Notice: Subject to any disclaimer, the term of this patent is extended or adjusted under 35 U.S.C. 154(b) by 0 days.

(21) Appl. No.: 15/108,805

(22) PCT Filed: Dec. 22, 2014

(86) PCT No.: PCT/FR2014/053512
§ 371 (c)(1),
(2) Date: Jun. 29, 2016

(87) PCT Pub. No.: WO2015/101739
PCT Pub. Date: Jul. 9, 2015

(65) Prior Publication Data
US 2016/0330879 A1    Nov. 10, 2016

(30) Foreign Application Priority Data
Dec. 30, 2013  (FR) ..................... 13 63671

(51) Int. Cl.
*B29C 70/08* (2006.01)
*B29C 70/88* (2006.01)
(Continued)

(52) U.S. Cl.
CPC ......... *H05K 9/0084* (2013.01); *B29C 70/088* (2013.01); *B29C 70/885* (2013.01);
(Continued)

(58) Field of Classification Search
CPC ... B29C 51/145; B29C 70/086; B29C 70/088; B29C 70/687; B29C 70/885;
(Continued)

(56) References Cited

U.S. PATENT DOCUMENTS

| 4,678,699 A | * | 7/1987 | Kritchevsky | ......... B29C 51/145 174/393 |
| 6,592,986 B1 | | 7/2003 | Hakotani et al. | |

(Continued)

FOREIGN PATENT DOCUMENTS

| CN | 1404189 A | * | 3/2003 |
| EP | 1099541 A1 | | 5/2001 |
| EP | 2647486 A1 | | 10/2013 |

OTHER PUBLICATIONS

International Search Report PCT/ISA/210 for International Application No. PCT/FR2014/053512 dated Apr. 1, 2015.
Written Opinion of the International Searching Authority PCT/ISA/237 for International Application No. PCT/FR2014/053512 dated Apr. 1, 2015.
(Continued)

*Primary Examiner* — Timothy Thompson
*Assistant Examiner* — Guillermo Egoavil
(74) *Attorney, Agent, or Firm* — Harness, Dickey & Pierce, P.L.C.

(57) ABSTRACT

Semi-finished product made from composite material comprising a thermoplastic or thermosetting matrix and reinforcement fillers. The semi-finished product comprises an electromagnetic shielding film positioned in the thickness of the semi-finished product, the electromagnetic shielding film comprising holes.

16 Claims, 2 Drawing Sheets

(51) Int. Cl.
*H05K 9/00* (2006.01)
*B29L 31/00* (2006.01)
*B29L 31/30* (2006.01)
*B29K 105/08* (2006.01)

(52) U.S. Cl.
CPC .... *H05K 9/0086* (2013.01); *B29K 2105/0872* (2013.01); *B29K 2995/0011* (2013.01); *B29L 2031/30* (2013.01); *B29L 2031/712* (2013.01)

(58) Field of Classification Search
CPC ..... B29C 70/08; B29C 70/88; B29L 2031/30; B29L 2031/712; B29K 2105/206; B29K 2105/0872; B29K 2995/0011; B29K 2995/0005; B29K 2995/0077; H05K 9/009; H05K 9/0084; H05K 9/0086; H05K 9/00; Y10T 442/116; Y10T 442/3846; Y10T 428/24636
USPC ................ 174/388, 393, 394; 264/241, 324; 336/84 C; 428/175; 442/10, 285
See application file for complete search history.

(56) References Cited

U.S. PATENT DOCUMENTS

| | | | | |
|---|---|---|---|---|
| 8,323,768 | B2* | 12/2012 | Connelly | G01R 33/285 |
| | | | | 174/392 |
| 2008/0175997 | A1* | 7/2008 | Goldstein | C08F 2/22 |
| | | | | 427/389.8 |
| 2010/0239798 | A1 | 9/2010 | Becklin | |
| 2012/0251814 | A1* | 10/2012 | Day | B29C 70/086 |
| | | | | 428/309.9 |
| 2013/0242487 | A1 | 9/2013 | Fujioka et al. | |
| 2014/0097831 | A1* | 4/2014 | Whaley | G01V 3/104 |
| | | | | 324/207.15 |
| 2015/0289425 | A1* | 10/2015 | Yoshida | H05K 9/009 |
| | | | | 428/113 |

OTHER PUBLICATIONS

French Search Report and Written Opinion for French Application No. FR 1363671 dated Sep. 16, 2014.

* cited by examiner

SEMI-FINISHED PRODUCT MADE FROM COMPOSITE MATERIAL, COMPRISING A FLEXIBLE ELECTROMAGNETIC SHIELDING FILM

CROSS-REFERENCE TO RELATED APPLICATIONS

This application is the U.S. National Phase application of PCT Application No. PCT/FR2014/053512 filed on Dec. 22, 2014, which claims priority to French Patent Application No. 1363671 filed on Dec. 30, 2013, the contents of each of which are incorporated herein by reference.

This invention relates to the technical field of plastic products.

The invention relates in particular to a composite material (semi-finished product) having an electromagnetic shielding property intended to manufacture a box to encapsulate electrical systems, such as batteries, carried on vehicles.

To encapsulate a battery pack for hybrid or electric vehicles, the solution currently often chosen is to provide a fully metal box, in particular aluminium. The choice of this metal is justified for its mechanical strength and the electromagnetic shielding properties which are essential to confine the strong fields generated by the batteries and the other electrical components.

However, metal boxes increase the weight of the vehicle in which they are installed and do not provide any electrical insulation to the outside. In addition, they are potentially dangerous for users. Lastly, metal boxes provide only poor thermal insulation, incompatible with maintaining and controlling the internal temperatures of the batteries with respect to external variations.

To remedy this weight problem, it is known to use boxes made at least partly from polymer or composite materials of the type comprising a thermoplastic or thermosetting resin and reinforcement fibres.

To give these boxes made partly from composite materials an electromagnetic shielding property, the following processes are also known:

- metallisation by conductive paint: this solution does not prove sufficiently efficient in the frequency and power ranges concerned by the battery systems carried on vehicles;
- overmoulding with metal grids, wire mesh or expanded metal: this method offers the advantage that it can be integrated in a moulding process. The metal layers withstand being stretched to adapt to the shapes of the part. However, this solution also proves insufficient in terms of shielding efficiency, even if the thicknesses can be increased and thus be relatively efficient at low frequencies, mainly due to the openings and discontinuities between the mesh holes;
- surface treatment by metallisation, for example by spraying molten metal or by electrolytic deposition of Zn, Cu or Al: this method seems to be efficient. However, this method may require high deposition thicknesses. This poses significant problems regarding the conversion methods, cycle times and industrial means to be deployed to work at automotive production rates;
- the use of special metals, called "mu metals," which have strong magnetic properties, generally obtained from ferrous materials with high nickel contents. These metals are known to act highly efficiently on low frequency electromagnetic fields. This solution is best suited to the vehicle. However, it exhibits saturation effects depending on the strength of the magnetic field, especially at higher frequencies, and, once again, it must be implemented in a thick layer to compensate for this phenomenon, which quickly poses weight problems since the density of these materials is greater than that of steel.

Furthermore, the advantage of a multilayer effect is known in the scientific literature: the shielding is very efficient on the surfaces of the screens rather than at the centre.

The invention aims to remedy these disadvantages by providing a semi-finished product for making a box adapted to the requirement of vehicles in terms of shape and use of volumes, while guaranteeing electromagnetic shielding behaviour. To do this, the semi-finished product according to the invention comprises a thermoplastic or thermosetting matrix and reinforcement fillers, as well as at least one electromagnetic shielding film positioned in the thickness of the semi-finished product, the electromagnetic shielding film comprising holes.

The semi-finished product according to the invention offers weight savings for the entire solution (complete box encapsulating the batteries of a vehicle and incorporating the shielding), compared with metal or composite solutions with metal spraying.

In addition, the method for manufacturing a box can be carried out continuously and at high production rates.

Preferably, the total area of the holes is much less than the area of the material forming the electromagnetic shielding film.

According to the invention, the electromagnetic shielding film can be perforated at regular intervals, and it may not be flat.

Preferably, the electromagnetic shielding film is a flexible metal film, or a metallised film. The electromagnetic shielding film can for example be an aluminium film.

According to one embodiment, the electromagnetic shielding film is positioned on the surface of the semi-finished product.

The semi-finished product may consist of a sheet, and the electromagnetic shielding film may be embedded in the thickness of the sheet. However, the electromagnetic shielding film may also be inserted between two sheets of composite material, forming a flexible core.

The semi-finished product may contain at least one layer comprising two electromagnetic shielding films separated by an electrically insulating medium.

The semi-finished product may include several strips of electromagnetic shielding films, the strips having a non-zero overlap. The strips may be coated with resin and/or a product chemically compatible with a resin of the thermoplastic or thermosetting matrix.

The invention also relates to a box accommodating onboard equipment for the storage and/or transmission of electric power for driving a motor vehicle, the box describing a surface completely enclosing a housing for receiving such equipment. This box is made with the semi-finished product according to the invention.

The invention also relates to a method for manufacturing a part by moulding, in which several strips of the semi-finished product according to the invention are used, and the strips are arranged so that after moulding, the entire part in a direction normal to the surfaces of the part is covered with at least one thickness of electromagnetic shielding film.

According to the invention, the part may be a box for accommodating onboard equipment for the storage and/or transmission of electric power for driving a motor vehicle, and the following steps are performed using a punch-die type mould:

several strips of the semi-finished product (SP) according to one of claims 1 to 12 are arranged on one of the mould walls, so that the entire surface of the box is covered by the electromagnetic shielding film (FBE) after opening the mould;

the mould is closed, and pressure and temperature chosen to enable the thermoplastic or thermosetting matrix to flow and polymerise are applied, so that the matrix provides cohesion by going through the holes (ORI) of the electromagnetic shielding film (FBE); and the box thus obtained is removed from the mould.

The entire surface of the box can be covered by the electromagnetic shielding film after opening the mould, by discontinuous overlapping strips of the semi-finished product.

Lastly, the overlap between each strip is preferably at least 30 mm to 40 mm.

The invention will be better understood on reading the accompanying figures, which are given solely by way of example and not limiting in any way, in which.

Figure 1:
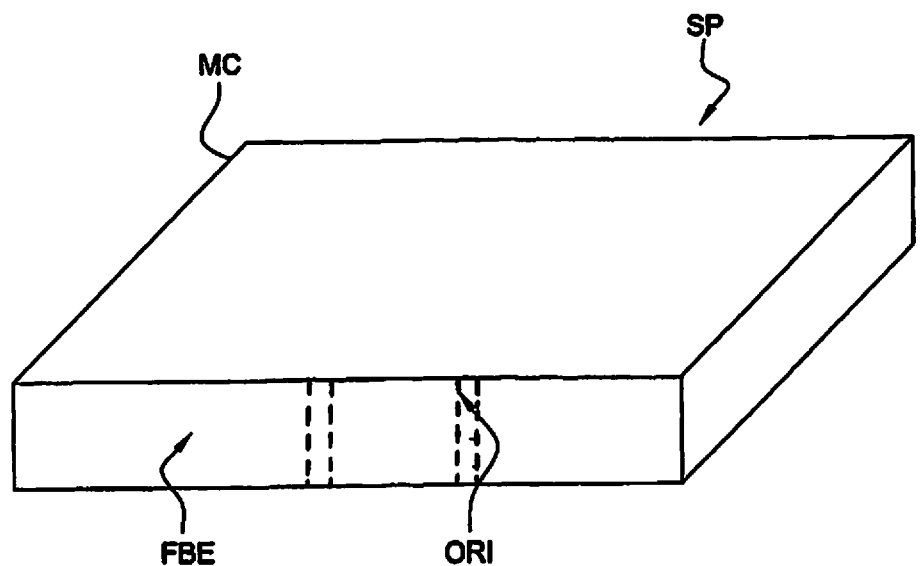
FIG. 1 shows an embodiment of the semi-finished product according to the invention.

The invention relates to a semi-finished product (SP), illustrated on FIG. 1 and comprising:

A composite material (MC) comprising:
   a thermoplastic or thermosetting matrix (PP, PA, UP or VE);
   fibrous reinforcement fillers (glass, natural fibres, carbon, etc.); and/or
   powder reinforcement fillers such as calcium carbonate.

At least one electromagnetic shielding film (FBE) positioned in the thickness of the semi-finished product, and comprising a set of holes (ORI).

The holes (ORI) of the electromagnetic shielding film (FBE) provide cohesion between the composite material (MC) and the shielding film (FBE). When moulding a part from a semi-finished product (SP) according to the invention, the material flows (FLU) through the holes (ORI) before hardening.

The size of the holes (ORI) is minimised to guarantee the electromagnetic shielding. However, a compromise can be determined to further minimise the weight of the finished part made from the semi-finished product.

Unlike a grid, the total area of the holes (ORI) is much less than the area of the material of the shielding film.

Preferably, the electromagnetic shielding film (FBE) is perforated at regular intervals so as to provide homogeneous cohesion.

The electromagnetic shielding film (FBE) may be a metal film. Preferably, the film is flexible, so as to provide only an electromagnetic shielding function while limiting the weight of the finished part, and not a function for reinforcing the semi-finished product.

The shielding film (FBE) is preferably made from aluminium. Its thickness is preferably between 0.1 mm and 0.5 mm.

The electromagnetic shielding film (FBE) may also be a metallised film made from a substrate compatible with the composite materials implemented.

Figure 3:
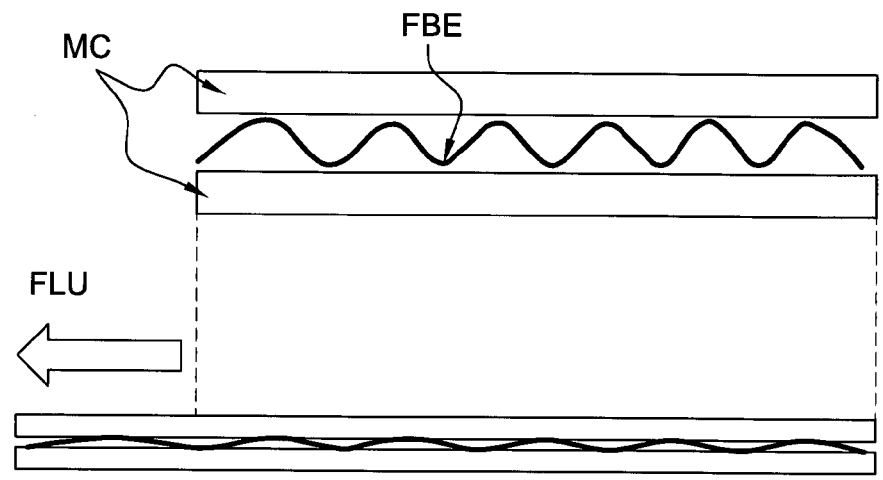
FIG. 3 illustrates an embossed shielding film and its use during moulding.

According to one embodiment, the electromagnetic shielding film (FBE) is not flat but has folds. For example and as illustrated on FIG. 3, a film may have an embossed shape, consisting of concentric circular pyramids for example. This configuration accompanies the flow (FLU) of the composite material during moulding as shown on FIG. 3, since the film "unfolds". Among other things, this avoids tearing the film.

Preferably, the semi-finished product (SP) according to the invention is prepared as plates (possibly as rolls) having one or more sheets of composite material.

According to a first embodiment, the shielding film (FBE) is embedded in the thickness of a sheet of composite material.

According to a second embodiment, the semi-finished product made from composite material incorporating a shielding film comprises:

A first sheet of composite material;
A second sheet of composite material;
A flexible metal or metallised film inserted between the two sheets of composite material, forming a flexible core, and perforated at regular intervals.

The advantage of these two embodiments is to provide protection for the shielding film against attacks or corrosion. In addition, the shielding system obtained is not conductive on the surface of the part. Consequently, the risk of contact with live components is eliminated.

However, according to a variant, the shielding film (FBE) is positioned on the surface of a sheet of composite material.

According to one embodiment, the semi-finished product (SP) according to the invention comprises several shielding films (FBE). These films may have different compositions and/or thicknesses and/or shapes.

Figure 2:
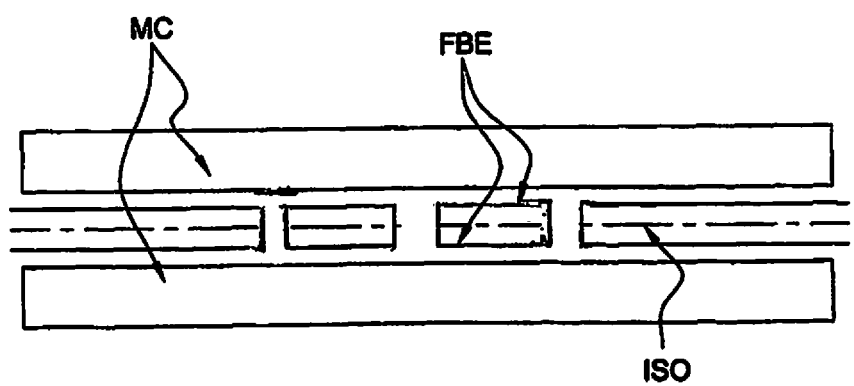
FIG. 2 illustrates the use of an electrically insulating medium inserted between two shielding films.

According to another embodiment (FIG. 2), the semi-finished product (SP) includes at least one layer comprising two electromagnetic shielding films (FBE) according to the invention separated by an electrically insulating medium (ISO) (consisting of polymer for example) as shown on FIG. 2. The semi-finished product (SP) according to the invention may comprise one or more of these layers, in combination or not with other shielding films (FBE). The insulating medium (ISO) may also be perforated in the same way as the electromagnetic shielding films (FBE).

The invention also relates to a box accommodating onboard equipment for the storage and/or transmission of electric power for driving a motor vehicle. The box describes a surface completely enclosing a housing for receiving such equipment. This box is made with the semi-finished product (SP) according to the invention.

The invention also relates to a method for manufacturing a box to encapsulate battery systems carried on vehicles.

To mould a part, such as a box, from the semi-finished product according to the invention, one or more strips of semi-finished product are used, arranged so that after moulding, the entire part in a direction normal to the surfaces of the part is covered with at least one thickness of electromagnetic shielding film (FBE). Thus, there are no breaks in the shielding film covering the part, in order to prevent any leakage of electromagnetic fields.

Figure 4:
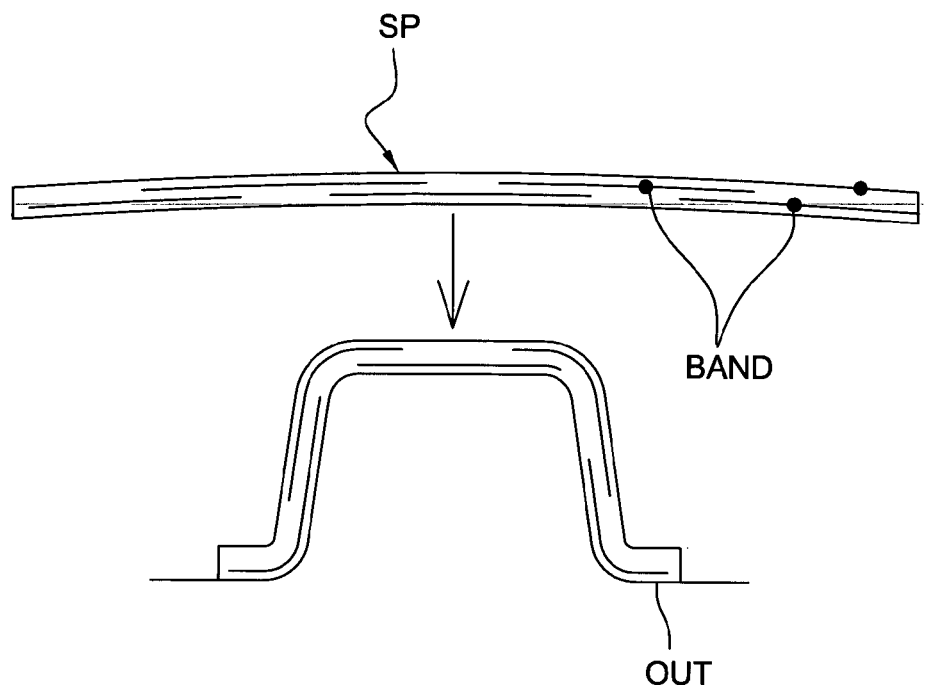
FIG. 4 illustrates the method for arranging strips of semi-finished product to form a finished product with no electromagnetic leakage.

Advantageously, the semi-finished product may already comprise several strips (BAND) of electromagnetic shielding film (FBE) with a non-zero overlap to facilitate this operation consisting in covering the shape of the tool (OUT). This configuration is illustrated on FIG. 4. This tool (OUT)

is either a mould which can convert the part under pressure or a shape used to produce a preform with the semi-finished product before loading it into a mould. Advantageously, when manufacturing the semi-finished product, the strips are coated with resin or a product chemically compatible with the resin used, so that they slide more easily during the part conversion method and improve the cohesion in the thickness of the part.

According to one example, to produce the part (box) according to the invention, a punch-die type mould is used, for example, and the following steps are performed:

several strips of semi-finished product (SP) according to the invention are arranged on the wall of the mould punch, so that the entire surface of the box is covered by the electromagnetic shielding film after opening the mould, and so that the entire shape in a direction normal to the surfaces of the part is covered with at least one thickness of shielding film. These strips are positioned so as to overlap each other. The overlaps are dimensioned and positioned so that after closing the die part the strips slide to form the part and so that the entire surface of the part is covered by the electromagnetic shielding film by discontinuous strips. According to one example, the overlap between each strip is at least 30 mm to 40 mm.

the mould is closed, and pressure and temperature chosen to enable the thermoplastic or thermosetting matrix to flow and polymerise are applied. It is possible to apply a low pressure (below 20 bar), but advantageously a high pressure is applied (greater than 80 bar) so that the composite material flows in the cavity and provides cohesion by going through the holes of the electromagnetic shielding film.

the part thus obtained is removed from the mould.

According to one embodiment, to guarantee the presence of the film at the edge of the part, the mould cavity is designed to be larger than the finished part. Manufacture is then completed by cutting the part which comes out of the mould.

The invention claimed is:

1. A semi-finished product made from a composite material including a thermoplastic or thermosetting matrix and reinforcement fillers, the semi-finished product comprising:
    a plurality of strips of an electromagnetic shielding film in a thickness of the semi-finished product, the electromagnetic shielding film including holes;
    wherein the plurality of strips have a non-zero overlap; and
    wherein the electromagnetic shielding film is not flat.

2. The semi-finished product according to claim 1, wherein a total area of the holes is less than an area of a material forming the electromagnetic shielding film.

3. The semi-finished product according to claim 1, wherein the electromagnetic shielding film is perforated at regular intervals.

4. Semi-finished product according to claim 1, wherein the electromagnetic shielding film is a flexible metal film, or a metallised film.

5. Semi-finished product according to claim 1, wherein the electromagnetic shielding film is an aluminium film.

6. Semi-finished product according to claim 1, wherein the electromagnetic shielding film is positioned on a surface of the semi-finished product.

7. Semi-finished product according to claim 1, wherein the semi-finished product consists of a sheet, and the electromagnetic shielding film is embedded in the thickness of the sheet.

8. Semi-finished product according to claim 1, wherein the electromagnetic shielding film is inserted between two sheets of composite material, forming a flexible core.

9. A semi-finished product made from a composite material including a thermoplastic or thermosetting matrix and reinforcement fillers, the semi-finished product comprising:
    a plurality of strips of an electromagnetic shielding film in a thickness of the semi-finished product, the electromagnetic shielding film including holes; and
    at least one layer having two electromagnetic shielding films separated by an electrically insulating medium;
    wherein the plurality of strips have a non-zero overlap.

10. The semi-finished product according to claim 1, wherein the strips are coated with resin and/or a product chemically compatible with a resin of the thermoplastic or thermosetting matrix.

11. A box accommodating onboard equipment for storage and/or transmission of electric power and configured to drive a motor vehicle, the box describing a surface substantially entirely enclosing a housing for receiving the onboard equipment,
    wherein the box is made with the semi-finished product according to claim 1.

12. A method for manufacturing a part by moulding, wherein the plurality of strips of the semi-finished product according to claim 1 are arranged so that after moulding, an entire part in a direction normal to a surface of the part is covered with at least one thickness of electromagnetic shielding film.

13. The method according to claim 12, wherein the part is a box for accommodating onboard equipment for storage and/or transmission of electric power for driving a motor vehicle, and the following steps are performed using a punch-die type mould:
    the plurality of strips of the semi-finished product are arranged on one of the mould walls, so that the entire surface of the box is covered by the electromagnetic shielding film after opening the mould;
    the mould is closed, and pressure and temperature chosen to enable the thermoplastic or thermosetting matrix to flow and polymerise are applied, so that the matrix provides cohesion by going through the holes of the electromagnetic shielding film; and
    the box is removed from the mould.

14. Method according to claim 13, wherein the entire surface of the box is covered by the electromagnetic shielding film after opening the mould, by discontinuous overlapping strips of the semi-finished product.

15. Method according to claim 14, wherein the overlap between each strip is at least 30 mm to 40 mm.

16. The semi-finished product of claim 1, wherein the electromagnetic shielding film has an embossed shape.

* * * * *

UNITED STATES PATENT AND TRADEMARK OFFICE
CERTIFICATE OF CORRECTION

PATENT NO. : 10,194,568 B2
APPLICATION NO. : 15/108805
DATED : January 29, 2019
INVENTOR(S) : Gerald Andre and Hugues Cheron It is certified that error appears in the above-identified patent and that said Letters Patent is hereby corrected as shown below:

On the Title Page

Item (71) Assignee should read as follows:
Compagnie Plastic Omnium, Lyon (FR)

Item (73) Applicant should read as follows:
Compagnie Plastic Omnium, Lyon (FR)

Signed and Sealed this
Second Day of June, 2020

Andrei Iancu
*Director of the United States Patent and Trademark Office*